United States Patent [19]

Lin

[11] Patent Number: 5,526,316
[45] Date of Patent: Jun. 11, 1996

[54] SERIAL ACCESS MEMORY DEVICE

[75] Inventor: James J. Y. Lin, Hsinchu, Taiwan

[73] Assignee: Winbond Electronics Corp., Hsinchu, Taiwan

[21] Appl. No.: 235,085

[22] Filed: Apr. 29, 1994

[51] Int. Cl.⁶ .............................. G11C 7/00; G11C 13/00
[52] U.S. Cl. ............... 365/221; 365/189.01; 365/230.01; 365/230.06; 365/230.08; 365/233; 365/239; 365/240
[58] Field of Search .................................... 365/221, 240, 365/189.01, 230.01, 230.06, 230.08, 233, 239

[56] References Cited

U.S. PATENT DOCUMENTS

| | | | |
|---|---|---|---|
| 4,159,541 | 6/1979 | Ward et al. | 365/233 |
| 4,677,594 | 6/1987 | Bisotto et al. | 365/240 |
| 4,802,134 | 1/1989 | Tsuyimoto | 365/230.01 |
| 4,870,621 | 9/1989 | Nakada | 365/230.05 |
| 4,873,671 | 10/1989 | Kowshik et al. | 365/189 |
| 4,903,242 | 2/1990 | Hamaguchi et al. | 365/230.05 |
| 5,198,999 | 3/1993 | Abe et al. | 365/189.05 |
| 5,265,049 | 11/1993 | Takasugi | 365/189.01 |

*Primary Examiner*—Viet Q. Nguyen
*Attorney, Agent, or Firm*—Fish & Richardson

[57] ABSTRACT

The serial access memory device provided has a first data terminal and a memory cell array having a plurality of address locations. The serial access memory device comprises a shift register and an address decode circuit. The shift register, responsive to an address clock signal, stores a first address value of a serial access memory operation. The shift register has an input terminal coupled to the first data terminal. The address decode circuit serially accesses the plurality of address locations of the memory cell array, responsive to an access control signal, the first address value, the address clock signal and the clock signal.

20 Claims, 7 Drawing Sheets ns5,526,316

SERIAL ACCESS MEMORY DEVICE

TECHNICAL FIELD OF THE INVENTION

The invention relates to a memory device and, in particular, to a serial access integrated circuit memory device.

BACKGROUND OF THE INVENTION

To meet the need of the multi-medium computer system nowadays, the integrated circuit memory device has been recently used for storing huge amount of information such as voice and image information. The information such as voice or image has characteristics of continuity of data. In other words, those information are, most of the time, stored and retrieved sequentially or serially.

In the conventional arts, there are two approaches to handle the issue of the digital voice storage. The first approach uses one single chip integrating the voice controller function as well as the voice storage memory function therein. This kind of system approach has a drawback of system inflexibility. For instance, the minimum capacity requirement of the integrated circuit memory device for 12 inches voice recording system differs from that for 6 inches. Under this situation, though the controller within the single chip still meet the users' need, the whole single chip should be replaced just because the limitation of the memory function itself.

The second approach is a two-chip solution, as disclosed in FIG. 1. The first single chip 13 takes care of the voice controller function and the second single chip 11 takes care of the voice storage issue. This approach obviously has a better system flexibility than the first one. However, many drawbacks are inherent with this approach. The first drawback relates to too many pins being required. Taking 256K SRAM as an example, the interface pins required at least include A0-A14 address lines, D0-D7 data lines, memory read (RD) and memory write (WR) lines, chip select (CS) control line, Vdd and Vss lines. The second drawback relates to the feasibility of the expansion of the memory size. When the requirement of expanding from 256K to 1M bits evolves, new address line A15, A16 are needed for the second single chip 11. The third drawback relates to the pin requirement on the first single chip 13. Since the controller 11 has to know if the memory chip 11 is exhausted for a memory operation, a plurality of selection signal, M1, M2 indicative of the memory type used are required for the controller 13. In FIG. 1, device 15 is an indication light, the device 17 is a speaker and the device 19 is a microphone.

To overcome the shortcomings as recited above inherent with the conventional arts, the first object of the invention is to provide a serial access memory device which has less pins requirement than that of the conventional arts.

The second object of the invention is to provide a serial access memory device which requires only a data line, an address clock line, a clock line as well as an access control signal to access the serial access memory device.

The third object of the invention is to provide a serial access memory device the pin configuration of which is independent of its memory size.

The fourth object of the invention is to provide a serial access memory device in which a plurality of memory locations may be accessed by receiving a first address value of the memory operation from the controller.

SUMMARY OF THE INVENTION

The serial access memory device provided has a first data terminal and a memory cell array having a plurality of address locations. The serial access memory device comprises a shift register and an address decode circuit.

The shift register, responsive to an address clock signal, stores a first address value of a serial access memory operation. The shift register has a first input terminal coupled to the first data terminal.

The address decode circuit serially accesses the plurality of address locations of the memory cell array, responsive to an access control signal, the first address value, the address clock signal and a clock signal.

The spirit and the further details of the invention will be further understood by the following detailed description of the invention along with the accompanied drawings.

DETAILED DESCRIPTIONS OF THE PREFERRED EMBODIMENTS OF THE INVENTION

Figure 1:
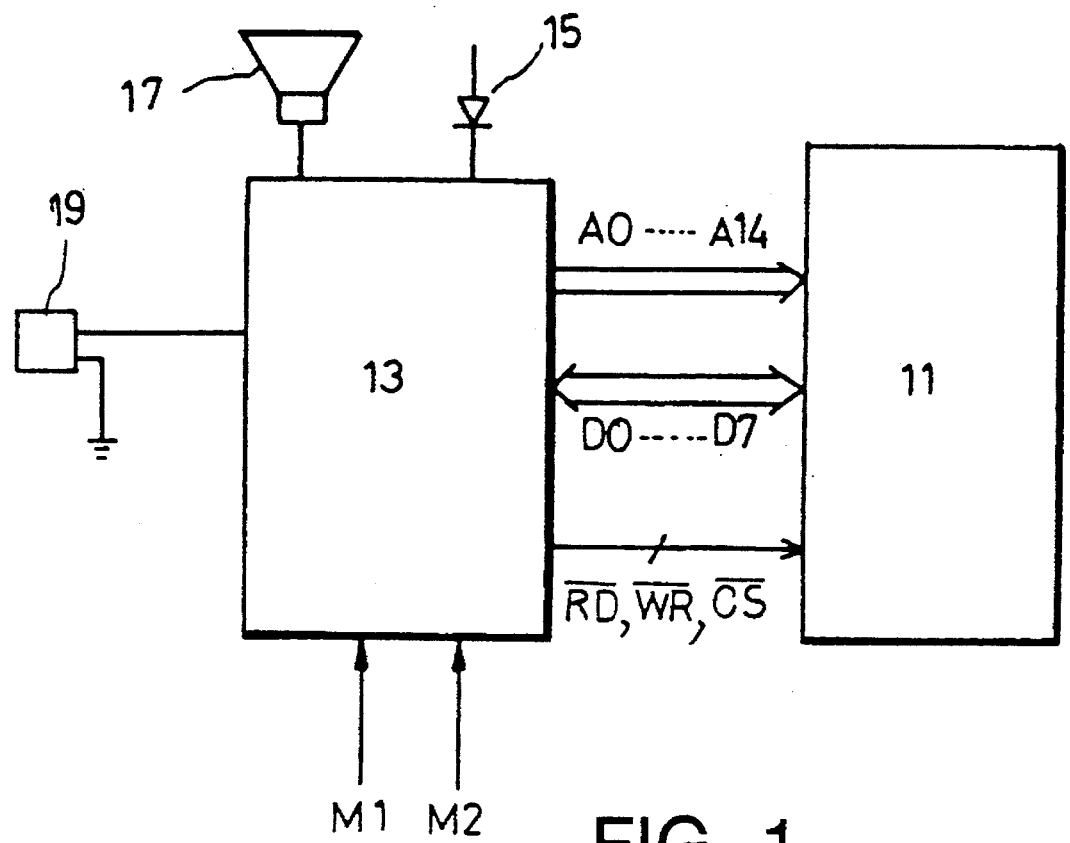
FIG. 1 shows a voice recorder system in accordance with the conventional art.
Figure 2:
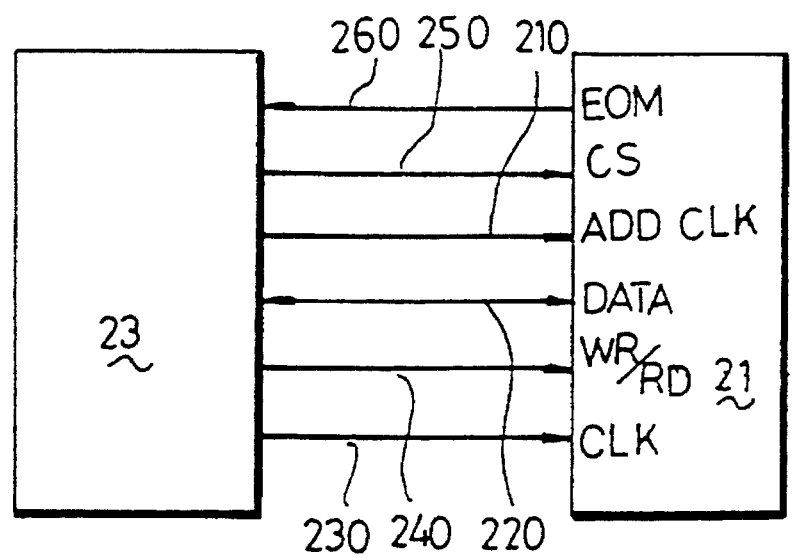
FIG. 2 shows a voice recorder system in accordance with the present invention.

As shown in FIG. 2, a serial access memory device 21 in accordance with the invention is coupled to a voice recorder controller 23. The information lines include a clock line (CLK) 230, an address clock (ADD CLK) line 210, a bidirection data (DATA) line 220, a memory read/write (WR/RD) line 240, a chip select (CS) line 250 and End of Memory (EOM) line 260. The memory read/write 240 line is a memory access control line.

Figure 3:
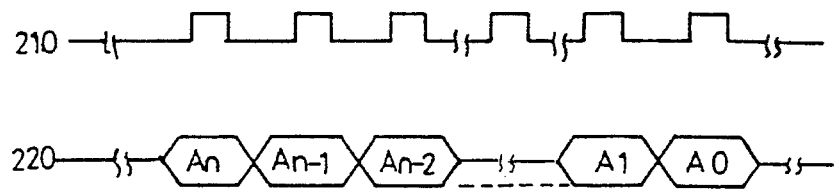
FIG. 3 shows the timing of the transmission of the first address value in accordance with the invention.

The data of the memory device 21 having a plurality of address locations are accessed serially through the data line 220. The data input terminal (DATA) of the memory device 21 serially inputs a first address value of a serial access memory operation during a first period of time, and serially transmits a data during a rest period of time. The timing of the transmission of the first address value through the data line 220 is disclosed in FIG. 3.

Figure 4:
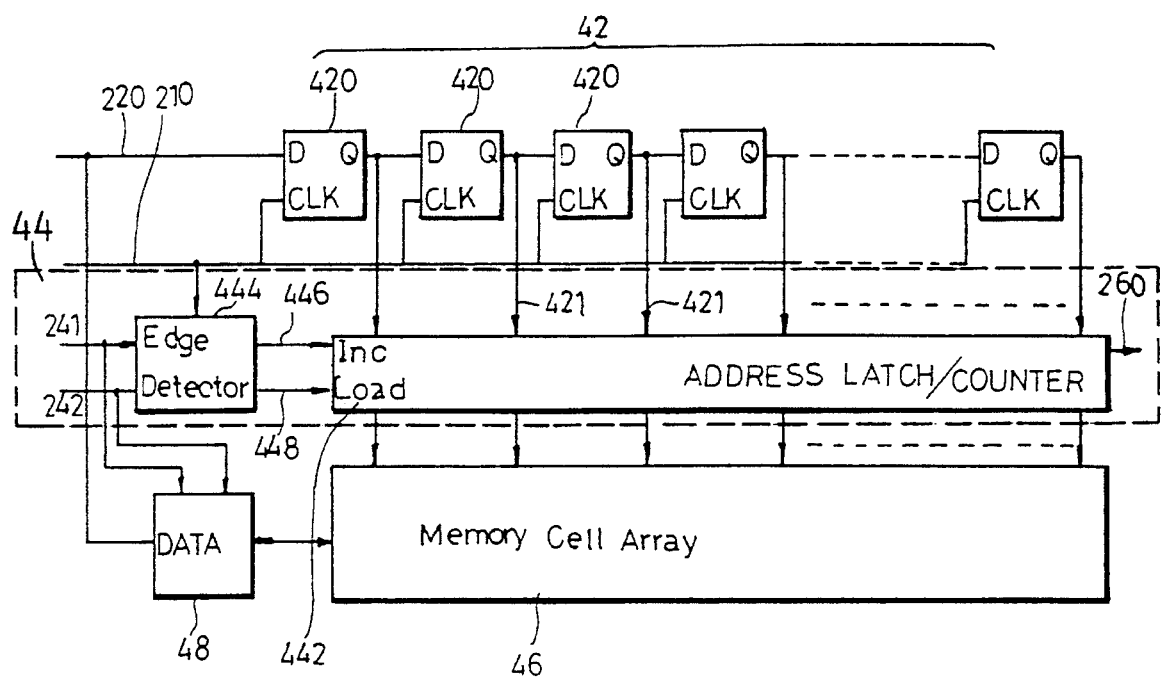
FIG. 4 shows one preferred embodiment of the detailed function of the serial access memory device of the invention.

As shown in FIG. 4, the serial access memory device 21 has a shift register 42, in response to the address clock signal 210, storing the first address value of a serial access memory operation. The shift register 42 has a first input terminal coupled to the data input terminal (DATA) of the memory device 21. The serial access memory device 21 has an address decode circuit 44 which serially accesses the plurality of address locations of the memory cell array 46, in response to a write signal 241 and a read signal 242, the first address value 421, the address clock signal 210. The write signal 241 and the read signal 242 both relate to the clock signal 230 and the memory write/read signal 240 the details of which will be recited thereinafter.

The shift register 42 has N data registers 420 each of which being coupled together in series to form the shift register 42. Each of the N data registers has a data output terminal (Q), a clock input terminal (CLK) and a data input terminal (D). The data input terminal of a first data register of the N data registers is the first input terminal of the shift register 42 and is coupled to the data input terminal (DATA). The clock input of each data register is adapted to receive the address clock signal 210.

The address decode circuit 44 has an address latch/counter 442, which has N input terminals each of which coupled to the data output terminal of one corresponding data register 420, in order to latch the first address value in response to a load signal 448, and to increment the value of the address location accessed in response to an increment signal 446. The address decode circuit 44 has an EOM terminal which outputs an End of Memory signal 260 when a last location of the memory cell array 46 is accessed.

The address decode circuit 44 further comprises an edge detector 444 which, responsive to the memory read/write signal 240, the clock signal 230 and the address clock signal 210, generates the load signal 448 and the increment signal 446.

The serial access memory device 21 has a data buffer 48 coupled to the data input terminal (DATA) of the memory device 21 and the memory cell array 46 respectively, to transmit the data corresponding to the address location accessed in response to the memory read/write signal 240 and the clock signal 230.

Figure 5:
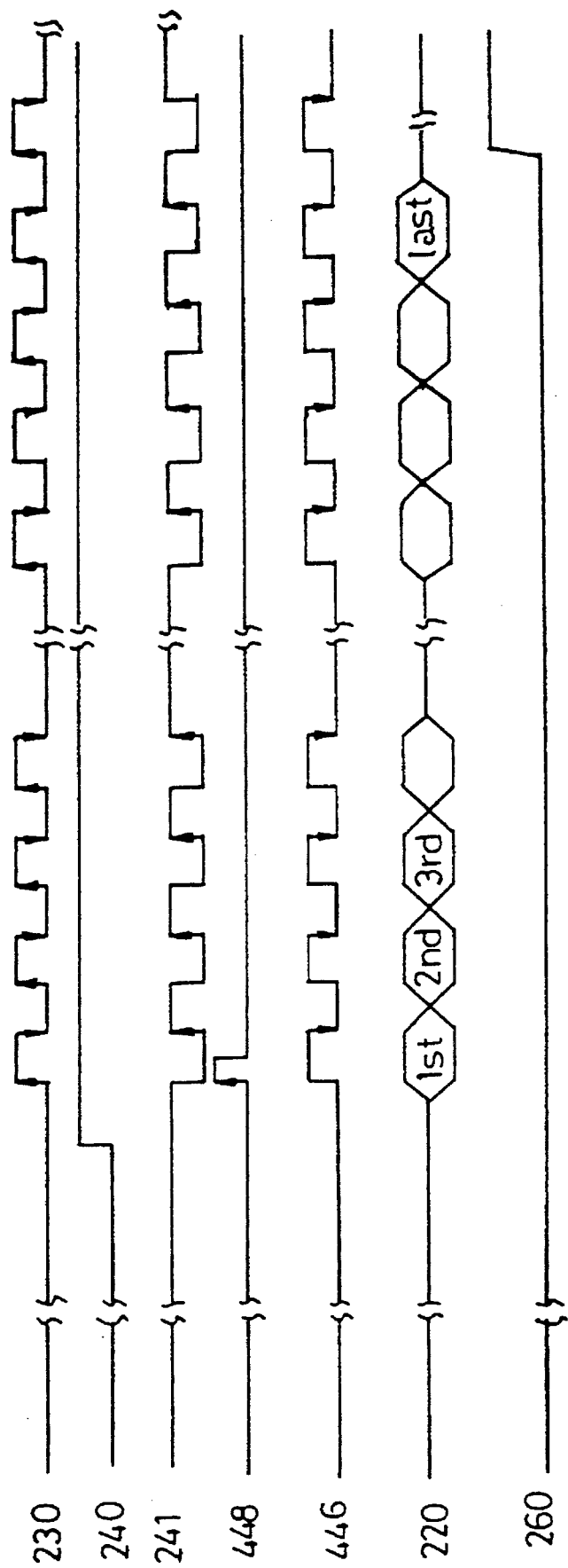
FIG. 5 shows the timing of the memory write operation in accordance with the invention.

The timing of a memory write operation of the invention is shown in FIG. 5 in which it may be found when a last memory location is accessed, an End of Memory signal (EOM) 260 is asserted (high). In the preferred embodiment shown in FIG. 5, the memory write operation is recognized when the memory WR/RD signal 240 is pulled high by the controller 23, and the memory read operation is recognized when the memory WR/RD signal 240 is pulled low by the controller 23.

Figure 6:
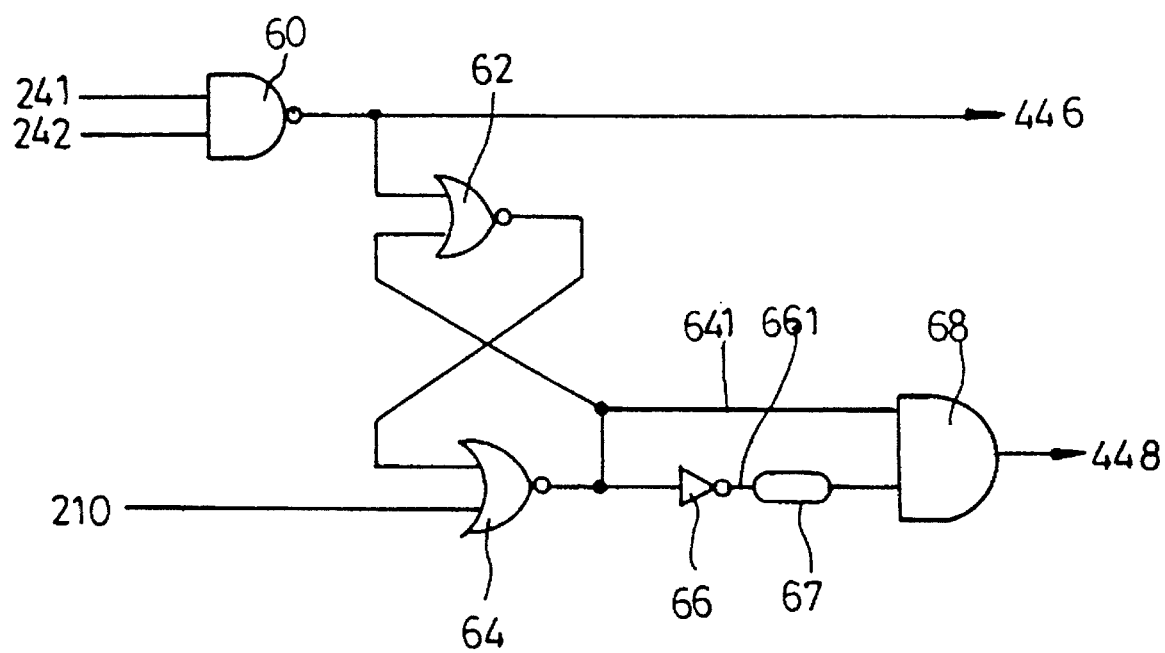
FIG. 6 shows a detailed arrangement of the edge detector function in FIG. 4.

One preferred embodiment of the edge detector 444, shown in FIG. 6, has a NAND gate 60, a first NOR gate 62, a second NOR gate 64, an inverter 66, a delay line 67 and an AND gate 68. The NAND gate 60 has two inputs receiving a read signal 242 and a write signal 241 respectively, and has an output generating the increment signal 446. The first NOR gate 62 has a first input, a second input and a first output. The first input receives the increment signal 446. The second NOR gate 64 has a third input, a fourth input and a second output. The third input receives the address clock signal 210, the fourth input is coupled to the first output of the first NOR gate 62, and the second output is coupled to the second input of the first NOR gate 62 and generates a second output signal 641. The inverter 66 has a fifth input and a third output. The fifth input is coupled to the second output of the second NOR gate 64 and the third output generates a third output signal 661. The AND gate 68, in response to the second output signal 641 and third output signal 661, generates the load signal 448.

Figure 7:
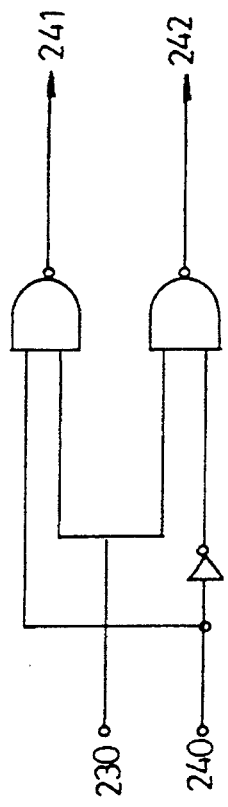
FIG. 7 shows how the write signal and read signal are generated from the clock signal and the access control signal.

From FIG. 7, it is shown that the write signal 241 is generated by NANDing the clock signal 230 and the memory read/write signal (WR/RD) 240, and the read signal 242 is generated by NANDing the clock signal 230 and the inverting signal of the memory read/write signal 240.

With the disclosed first preferred embodiment, the invention provides the following advantages over the conventional arts.

First, one DATA line 220 and one address clock line 210 are only required to access the memory cell array 21 serially at a competitive access speed.

Second, the interface pins between the controller 23 and the integrated memory device 21 are kept the same no matter what size the memory device is, i.e. 256K, 1M, etc..

Third, the built-in address latch/counter 442 within the memory device 21 will output a End of Memory signal 260 to the controller 23 as a last address location is accessed. There is no need to implement the select signals M1, M2 for memory type (size) used thereby saving more pins.

Fourth, different type or different length of the memory device 21 maybe coupled to same controller without any modifications to either the memory device 21 or the controller 23.

There is one shortcoming, if any, for the first embodiment of the invention recited above.

Since the number of the data registers 420 is fixed, for instance, 20 data registers 420 for 1M SRAM, the address clock signal 210 should reach 20 clocks to accurately access the memory cell array 46. If the controller 23 sends out more than 20 clocks on the address clock line 210, the shift register 420 can only hold the last 20 data sent on the data line 220, and eventually the memory access operation of the type is limited by the size of the memory device 21. If the controller 23 send out, however, less than 20 clocks on the address clock line 210, errors will occur due to the residual bit value in some higher bits of the shift registers 42. Further disclosed in FIG. 8 is a second embodiment of the invention to solve the mentioned shortcoming of the first embodiment.

The serial access memory device shown has the same shift register 42, address latch/counter 442, memory cell array 46, edge detector 444, data buffer 48 as those of the first embodiment. The functions and operations of the most devices in FIG. 8 under the corresponding input signals maybe referred to the corresponding recitations above of the first embodiment of FIG. 4 and will not be reiterated thereinafter.

Figure 8:
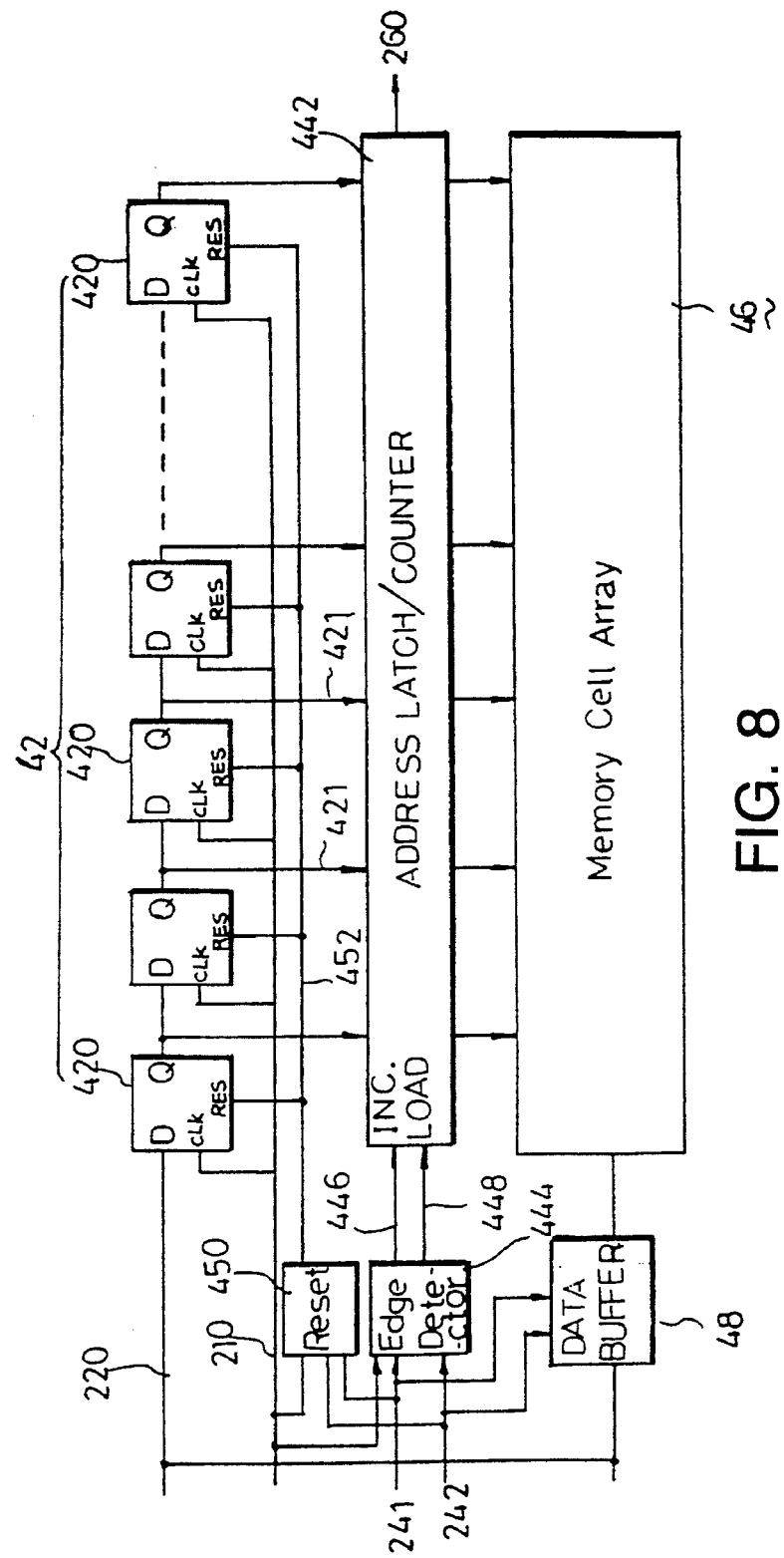
FIG. 8 shows a second preferred embodiment of the invention.

The reset function 450 in FIG. 8 responses to the address clock signal 210, the read signal 242 and the write signal 241, and generates a reset signal 452 to reset the shift register 42. A preferred embodiment of the reset function 450 is disclosed in FIG. 9.

As shown, the reset function 450 has a NAND gate 90, a first NOR gate 92, a second NOR gate 94, an inverter 96, a delay line 97 and a NOR gate 98. The NAND gate 90 has two inputs receiving a read signal 242 and a write signal 241 respectively, and has an output. The first NOR gate 92 has a first input, a second input and a first output. The first input couples to the output of the NAND gate 90. The second NOR gate 94 has a third input, a fourth input and a second output. The third input receives the address clock signal 210, and the fourth input is coupled to the first output of the first NOR gate 92, and the second output is coupled to the second input of the first NOR gate 92 and generates a second output signal 941. The inverter 96 has a fifth input and a third output. The fifth input is coupled to the second output of the second NOR gate 94 and the third output generates a third output signal 961. The NOR gate 98, in response to the second output signal 941 and third output signal 961, generates the reset signal 452.

Figure 9:
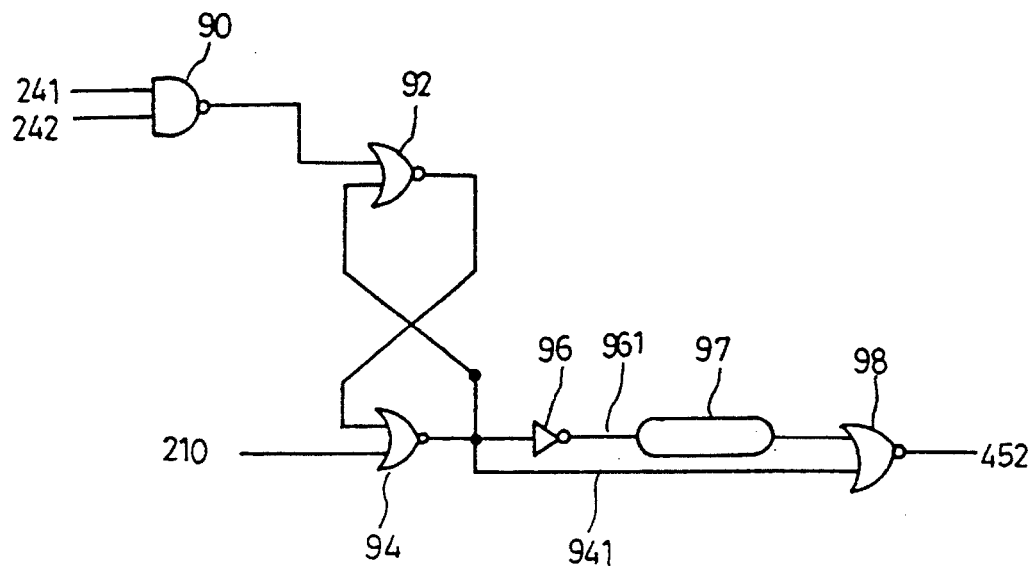
FIG. 9 shows a detailed arrangement of the reset function in FIG. 8.
Figure 10:
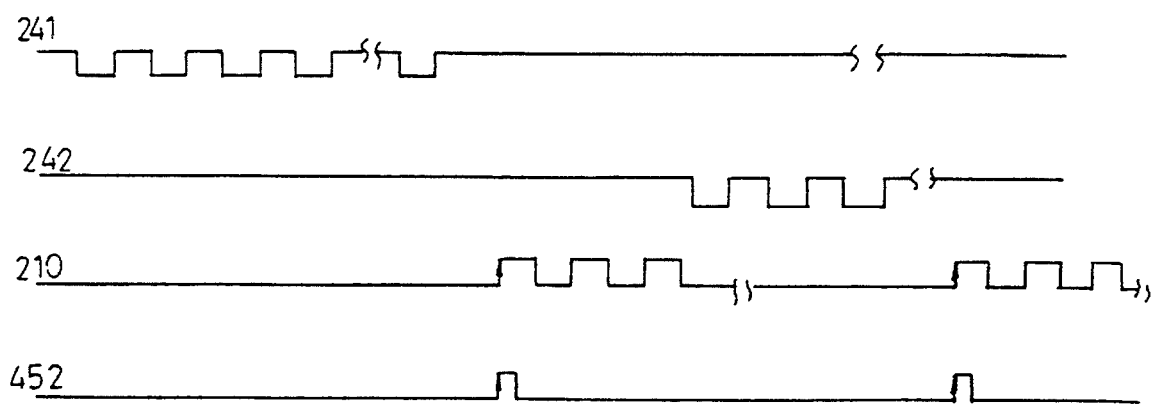
FIG. 10 is the timing relationship of the signals in FIG. 9.

The timing of the signals depicted in FIG. 9 is shown in FIG. 10. The write signal 241, read signal 242 are generated by the circuit shown in FIG. 7.

Since the reset signal 452 is asserted at the first active address clock 210 after the previous read signal 242 or write signal 241 is de-asserted, the shift register 420 is reset thereby to accurately stores the next first address value clocked in by the address clock signal 210, which has bits less than the number of the data registers 420. The error due to the residual value in some higher bits is therefore avoided.

Figure 11:
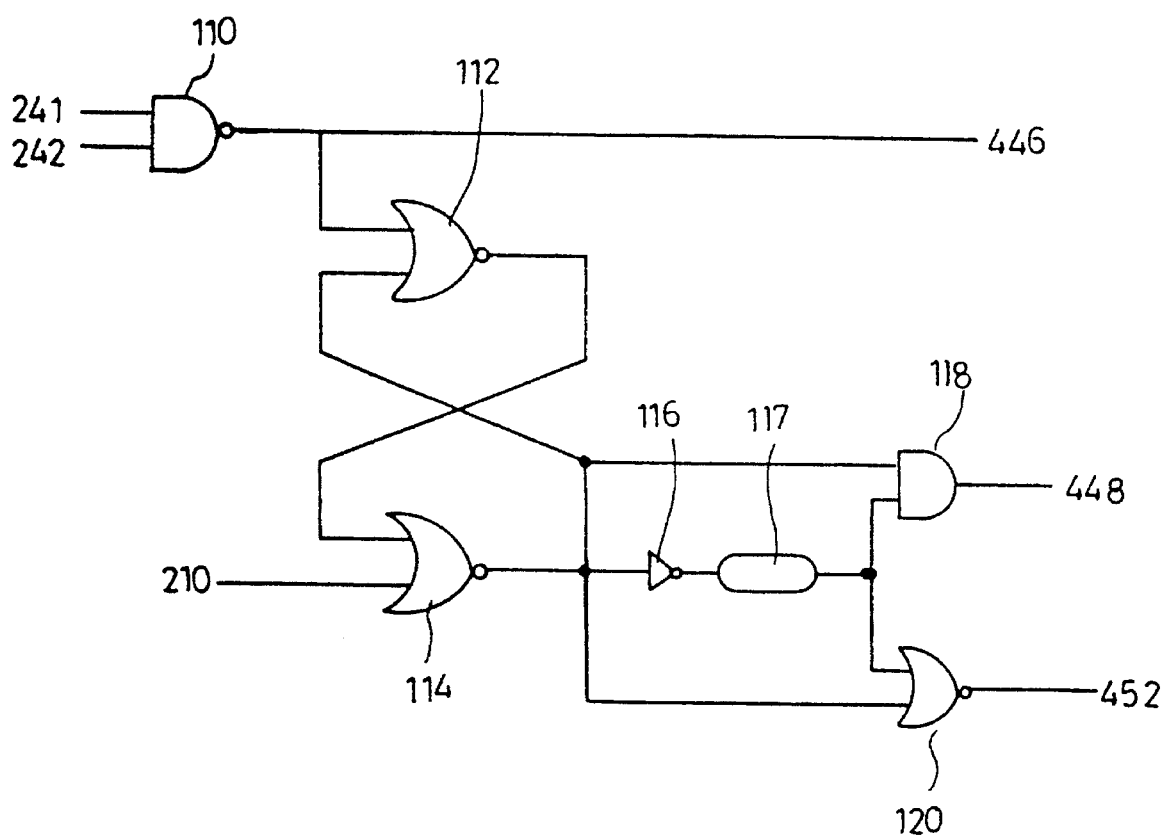
FIG. 11 shows a circuit implementing both the edge detector function and the reset function within the invention.

The detailed blocks of the preferred embodiments of the invention aforesaid are illustrative rather than limiting. Any equivalent modifications, substitutes, alterations or changes to the preferred embodiment without departing from the spirit of the invention are likely to the persons ordinary skill in the art, and are still within the intended scope of the protection of the invention which is defined by the following claims. For instance, the preferred embodiment for the edge detector 444 shown in FIG. 6 and for the reset circuit shown in FIG. 9 may be combined easily into a circuit shown in FIG. 11 to generate the reset signal 452, the increment signal 446 and the load signal 448 which is obvious to persons skillful in the arts.

What is claimed is:

1. A serial access memory device comprising:
   a single data terminal for serially receiving an address signal during a first period of time and for serially transmitting or receiving a plurality of sets of data signal during a second different period of time;
   a memory cell array having a plurality of address locations each of which stores one of the plurality of sets of data signal;
   a shift register, in response to an address clock signal, for storing a first address value of a serial access memory operation, the first address value received from the single data terminal during the first period of time;
   an address decode circuit for serially accessing the plurality of address locations of said memory cell array, in response to a read access or a write access control signal, the first address value, the address clock signal, and a clock signal;
   wherein, during the second different period of time and with the write access control signal being asserted, the plurality of sets of data signal, which are serially received through the single data terminal, are stored at the plurality of address locations in response to the write access control signal and the clock signal, and during the second different period of time and with the read access control signal being asserted, the plurality of sets of data signal from the plurality of address locations are transmitted serially through the single data terminal in response to the read access control signal and the clock signal.

2. The memory device as recited in claim 1, wherein the shift register includes N data registers coupled together in series to form said shift register, each of the N data registers having a data output terminal (Q), a clock input terminal (CLK) and a data input terminal (D), the data input terminal of a first data register of the N data registers coupled to the single data terminal, the clock input terminal of each data register being adapted to receive the address clock signal.

3. The memory device as recited in claim 2, wherein the address decode circuit includes an address latch/counter which has N input terminals each of which is coupled to the data output terminal (Q) of one corresponding data register, for latching the first address value in response to a load signal, and for incrementing the value of the address latch/counter in response to an increment signal.

4. The memory device as recited in claim 1, wherein the address decode circuit includes an EOM terminal for sending an End of Memory signal when a last address location of the memory cell array is accessed.

5. The memory device as recited in claim 3, wherein the address decode circuit further comprising:
   an edge detector, in response to the read or write access control signals, the address clock signal and the clock signal, to generate the load signal and the increment signal.

6. The memory device as recited in claim 5, wherein the edge detector comprising:
   a NAND gate having two inputs receiving the read access control signal and the write access control signal respectively, and having an output generating the increment signal;
   a first NOR gate having a first input, a second input and a first output, the first input receiving the increment signal;
   a second NOR gate having a third input, a fourth input and a second output, the third input receiving the address clock signal, the fourth input being coupled to the first output of the first NOR gate, and the second output being coupled to the second input of the first NOR gate and generating a second output signal;
   an inverter having a fifth input and a third output, the fifth input being coupled to the second output of the second NOR gate, the third output generating a third output signal;
   an AND gate, in response to the second and third output signal, for generating the load signal.

7. A serial access memory device, comprising:
   a single data terminal for serially receiving an address signal during a first period of time, and for serially transmitting or receiving a plurality of sets of data signal during a second different period of time;
   a memory cell array having a plurality of address locations;
   a data buffer, coupled to the single data terminal and the memory cell array respectively, wherein, during the second different period of time and with a write access control signal being asserted, the plurality of sets of data signal, which are serially received through the single data terminal, are stored at the plurality of address locations in response to the write access control signal and a clock signal, and during the second different period of time and with a read access control signal being asserted, the plurality of sets of data signal from the plurality of address locations are transmitted serially through the single data terminal in response to the read access control signal and the clock signal.

8. The memory device as recited in claim 7, further comprising:
   a shift register, in response to an address clock signal, for storing a first address value of a serial access memory operation, the first address value received from the single data terminal during the first period of time.

9. The memory device as recited in claim 8, wherein the shift register includes N data registers coupled together in series to form said shift register, each of the N data registers having a data output terminal (Q), a clock input terminal (CLK) and a data input terminal (D), the data input terminal of a first data register of the N data registers coupled to the single data terminal, the clock input terminal of each data register being adapted to receive the address clock signal.

10. The memory circuit as recited in claim 9, wherein the address decode circuit includes an address latch/counter which has N input terminals each of which is coupled to the data output terminal (Q) of one corresponding data register, for latching the first address value in response to a load signal and for incrementing the value of the address latch/counter in response to an increment signal.

11. The memory device as recited in claim 7, wherein the address decode circuit includes an EOM terminal for sending an End of Memory signal when a last address location of the memory cell array is accessed.

12. The memory device as recited in claim 10, wherein the address decode circuit further comprising:

an edge detector, in response to the read access or write access control signals, the address clock signal and the clock signal, to generate the load signal and the increment signal.

13. The memory device as recited in claim 12, wherein the edge detector comprising:

a NAND gate having two inputs receiving the read access control signal and the write access control signal respectively, and having an output generating the increment signal;

a first NOR gate having a first input, a second input and a first output, the first output receiving the increment signal;

a second NOR gate having a third input, a fourth input and a second output, the third input receiving the address clock signal, the fourth input being coupled to the first output of the first NOR gate, and the second output being coupled to the second input of the first NOR gate and generating a second output signal;

an invertor having a fifth input and a third output, the fifth input being coupled to the second output of the second NOR gate, the third output generating a third output signal;

an AND gate, in response to the second and third output signal, for generating the load signal.

14. The memory device as recited in claim 1 further comprising:

a reset circuit, in response to the read access or write access control signal, the clock signal and the address clock signal, for generating a reset signal to reset the shift register.

15. The memory device as recited in claim 14, wherein the shift register includes N data registers coupled together in series to form said shift register, each of the N data registers having a data output terminal (Q), a clock input terminal (CLK) and a data input terminal (D), the data input terminal of a first data register of the N data registers coupled to the single data input terminal, the clock input terminal of each data register being adapted to receive the address clock signal.

16. The memory device as recited in claim 15, wherein the address decode circuit includes an address latch/counter which has N input terminals each of which being coupled to the data output terminal of one corresponding data register, for latching the first address value in response to a load signal and for incrementing the value of the address latch/counter in response to an increment signal.

17. The memory device as recited in claim 14, wherein the address decode circuit includes an output terminal for sending an End of Memory signal when a last address location of the memory cell array is accessed.

18. The memory device as recited in claim 16, wherein the address decode circuit further comprising:

an edge detector, in response to the read access or write access control signals, the address clock signal and the clock signal, to generate the load signal and the increment signal.

19. The memory device as recited in claim 18, wherein the edge detector comprising:

a NAND gate having two inputs receiving the read access control signal and the write access control signal respectively, and having output generating the increment signal;

a first NOR gate having a first input, a second input and a first output, the first input receiving the increment signal;

a second NOR gate having a third input, a fourth input and a second output, the third input receiving the address clock signal, the fourth input being coupled to the first output of the first NOR gate, and the second output being coupled to the second input of the first NOR gate and generating a second output signal;

an inverter having a fifth input and a third output, the fifth input being coupled to the second output of the second NOR gate, the third output generating a third output signal;

an AND gate, in response to the second and third output signal, for generating the load signal.

20. The memory device as recited in claim 14, wherein the reset circuit comprising:

a NAND gate having two inputs receiving the read access control signal and the write access control signal respectively, and having an output;

a first NOR gate having a first input, a second input and a first output, the first input coupled to the output of the NAND gate;

a second NOR gate having a third input, a fourth input and a second output, the third input receiving the address clock signal, the fourth input being coupled to the first output of the first NOR gate, and the second output being coupled to the second input of the first NOR gate and generating a second output signal;

an inverter having a fifth input and a third output, the fifth input being coupled to the second output of the second NOR gate, the third output generating a third output signal;

a NOR gate, in response to the second and third output signal, for generating the reset signal.

* * * * *